(12) United States Patent
Wang et al.

(10) Patent No.: US 7,042,766 B1
(45) Date of Patent: May 9, 2006

(54) METHOD OF PROGRAMMING A FLASH MEMORY DEVICE USING MULTILEVEL CHARGE STORAGE

(75) Inventors: Zhigang Wang, Sunnyvale, CA (US); Nian Yang, Mountain View, CA (US); Zhizheng Liu, Sunnyvale, CA (US)

(73) Assignee: Spansion, LLC, Sunnyvale, CA (US)

( * ) Notice: Subject to any disclaimer, the term of this patent is extended or adjusted under 35 U.S.C. 154(b) by 55 days.

(21) Appl. No.: 10/896,651

(22) Filed: Jul. 22, 2004

(51) Int. Cl.
*G11C 16/06* (2006.01)

(52) U.S. Cl. .......................... 365/185.22; 365/185.28; 365/185.24

(58) Field of Classification Search ............... None
See application file for complete search history.

(56) References Cited

U.S. PATENT DOCUMENTS

| | | | |
|---|---|---|---|
| 6,009,017 A | 12/1999 | Guo et al. | |
| 6,215,702 B1 | 4/2001 | Derhacobian et al. | |
| 6,246,611 B1 | 6/2001 | Pawletko et al. | |
| 6,295,228 B1 | 9/2001 | Pawletko et al. | |
| 6,307,784 B1 | 10/2001 | Hamilton et al. | |
| 6,309,926 B1 | 10/2001 | Bell et al. | |
| 6,331,951 B1 | 12/2001 | Bautista, Jr. et al. | |
| 6,344,994 B1 | 2/2002 | Hamilton et al. | |
| 6,356,482 B1 | 3/2002 | Derhacobian et al. | |
| 6,370,061 B1 | 4/2002 | Yachareni et al. | |
| 6,400,624 B1 | 6/2002 | Parker et al. | |
| 6,442,074 B1 | 8/2002 | Hamilton et al. | |
| 6,456,533 B1 * | 9/2002 | Hamilton et al. | 365/185.22 |
| 6,522,585 B1 | 2/2003 | Pasternak | |
| 6,661,720 B1 * | 12/2003 | Chevallier | 365/201 |
| 6,914,823 B1 * | 7/2005 | Chen et al. | 365/185.22 |

* cited by examiner

*Primary Examiner*—David Lam
(74) *Attorney, Agent, or Firm*—Renner, Otto, Boisselle & Sklar, LLP

(57) ABSTRACT

Disclosed is a method of programming a flash memory device to store an amount of charge corresponding to one of a plurality of charged program states. The method can include pulsing the memory device with program voltages including at least a gate voltage. If the gate voltage is greater than or equal to a predetermined minimum threshold voltage for the one of the plurality of charged program states, an amount of charge stored by the memory device can be verified. Otherwise the memory device can be repulsed. This procedure can be carried out until verifying is conducted and the verifying indicates that the amount of charge stored by the memory device corresponds to the one of the plurality of charged program states.

9 Claims, 3 Drawing Sheets

METHOD OF PROGRAMMING A FLASH MEMORY DEVICE USING MULTILEVEL CHARGE STORAGE

TECHNICAL FIELD

The present invention relates generally to the field of non-volatile memory devices and, more particularly, to a method of storing multiple data states in a flash memory device using incremented program voltage pulses.

BACKGROUND

A pervasive trend in modern integrated circuit manufacture is to increase the amount of data stored per unit area on an integrated circuit memory unit, such as a flash memory unit. That is, as flash memory technology progresses, the speed and memory density becomes higher and higher. Modern flash memory units are characterized by the non-volatility of the charge stored in the arrays of memory cells that make up the memory unit.

Memory units often include a relatively large number of core memory devices (sometimes referred to as core memory cells). These core memory devices can comprise a floating gate device where a conductive charge storing region (or floating gate) is located between a conductive wordline and a channel region of a substrate. The channel region is laterally disposed between a pair of bitlines. The floating gate can be separated from the wordline and the channel region by respective dielectric layers. In an alternative arrangement, the floating gate can be replaced by a non-conductive charge storing layer that can store data in plural charge storing regions. For example, a normal bit can be stored using a charge storing region adjacent a first bitline associated with the memory device and a complimentary bit can be stored using a charge storing region adjacent a second bitline associated with the memory device.

Programming of the foregoing memory devices can be accomplished, for example, by hot electron injection. Hot electron injection involves "pulsing" the device by applying appropriate voltage potentials to each of the wordline (the wordline connected to or defining a control gate of the memory device) and a drain of the memory device for a specified duration. During the programming pulse, the source can be grounded or coupled to a bias potential to assist in controlling the amount of charge injected into the memory device. Reading of the memory device can be accomplished by applying an appropriate voltage to each of the gate, source and/or drain and comparing the drain to source current (as an indication of device threshold voltage) against a reference value to thereby determine if each memory cell is in a programmed or an unprogrammed state.

Even though conventional charge trapping flash memory units are capable of storing a relatively large amount of data in a relatively small area, there is an ever increasing demand to store even more data per unit area of a memory core and for methods of increasing the speed with which the data can be programmed.

SUMMARY OF THE INVENTION

According to one aspect of the invention, the invention is directed to a method of programming a flash memory device to store an amount of charge corresponding to one of a plurality of charged program states. The method can include a) pulsing the memory device with program voltages including at least a gate voltage, and if the gate voltage is greater than or equal to a predetermined minimum threshold voltage for the one of the plurality of charged program states, verifying an amount of charge stored by the memory device, else re-pulsing the memory device; and b) repeating a) until the verifying indicates that the amount of charge stored by the memory device corresponds to the one of the plurality of charged program states.

According to another aspect of the invention, the invention is directed to a method of programming a flash memory device to store an amount of charge corresponding to a target charged program state from a plurality of charged program states. The method can include successively pulsing the memory device with program voltages including a gate voltage until the gate voltage is greater than or equal to a minimum threshold voltage for the target charged program state; and verifying the program state of the memory device when the gate voltage is greater than or equal to a minimum threshold voltage for the target charged program state.

BRIEF DESCRIPTION OF DRAWINGS

These and further features of the present invention will be apparent with reference to the following description and drawings, wherein.

DISCLOSURE OF INVENTION

Figure 1:
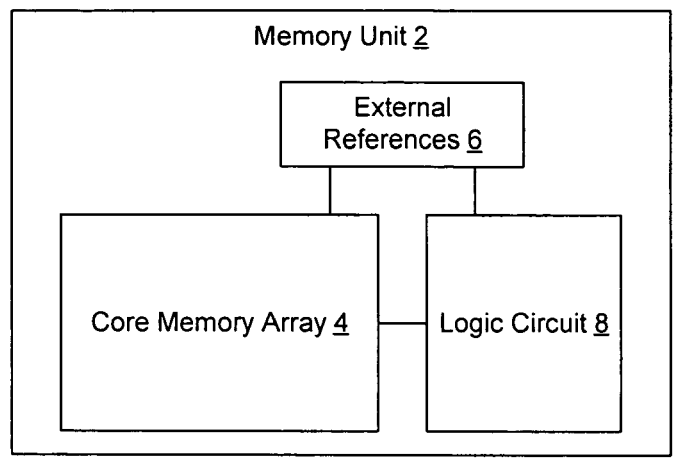
FIG. 1 is a schematic block diagram of an exemplary memory unit having a plurality of core memory devices to which a method of programming in accordance with the present invention can be applied.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Aspects of the present invention relate to a method of programming a non-volatile, flash electrically erasable and programmable memory device, such as a floating gate memory cell or a dielectric charge storing device. More specifically, the method relates to storing one of multiple charge amounts with the memory device to increase the density with which data can be stored in a memory unit. The use of multiple charge amounts is referred to in the art as multilevel charge (MLC) programming. As will be described in detail below, during programming of the memory device to store a target charge level, incremented program pulses can be applied to a gate of the memory device. The program pulses are applied until the voltage of the program pulse is at least as high as a minimum target threshold voltage of the memory device. Thereafter, a program verify operation is carried out. If the program verify operation determines that the memory device is not sufficiently charged, another program pulse can be applied followed another program verify operation. The program/verify operation is carried out until the desired charge level is established.

The techniques described herein are applicable to a variety of flash memory devices, including NOR architecture memory devices such as floating gate memory devices and dielectric charge storing devices having two or more charge storing regions per device. It should be recognized that other types of memory devices, such as NAND architecture memory devices, also can be programmed using the techniques described herein. Nevertheless, the present invention will be described in the exemplary context of programming a floating gate memory device.

With reference to FIG. 1, shown is a schematic block diagram of an exemplary memory unit 2. The memory unit 2 can include a core memory array 4 containing a plurality of memory devices that include, for example, core memory devices for storing data, and dynamic reference memory devices for tracking data level behavior of the core memory devices over time. Other memory devices, such as external references 6, can also form a part of the memory unit 2. The external reference 6 are separate from the core memory array 4 and can include, for example, erase verify reference cells, program verify reference cells and soft programming reference cells. Various operations of the memory unit 2, including, for example, programming, verifying, reading and erasing, can be controlled by a logic circuit 8. As one skilled in the art will appreciate, the memory unit 2 can be used by a customer of the memory unit 2 to store information, such as data or executable code.

Figure 2:
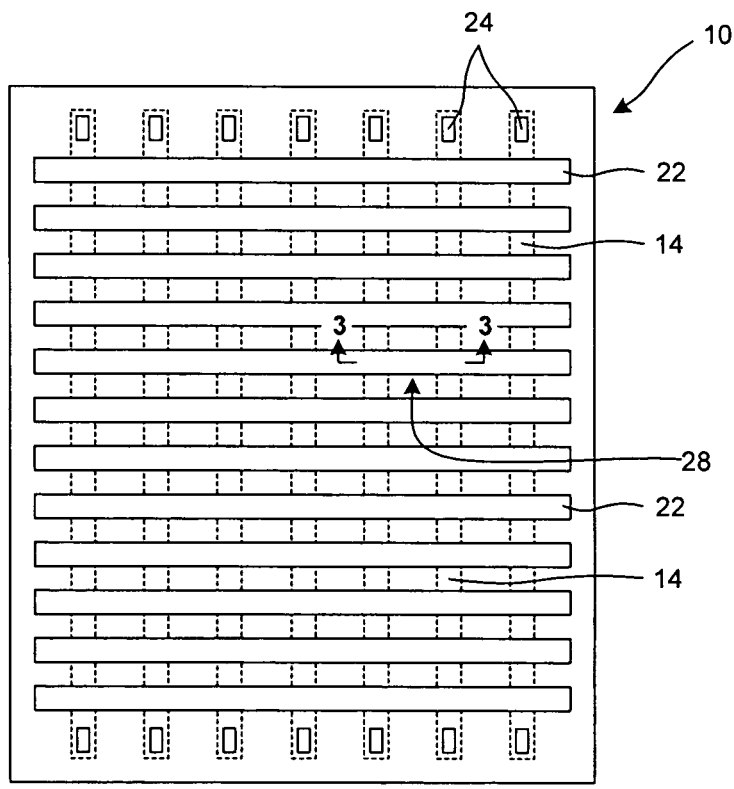
FIG. 2 is a schematic block diagram of an example core memory array sector from the memory unit.

With additional reference to FIG. 2, shown is a top view, schematic block diagram of an exemplary core memory array sector 10. It should be understood that the core memory array sector 10 can be sized as desired. The memory array 4 of the memory unit 2 can include multiple sectors 10.

Figure 3:
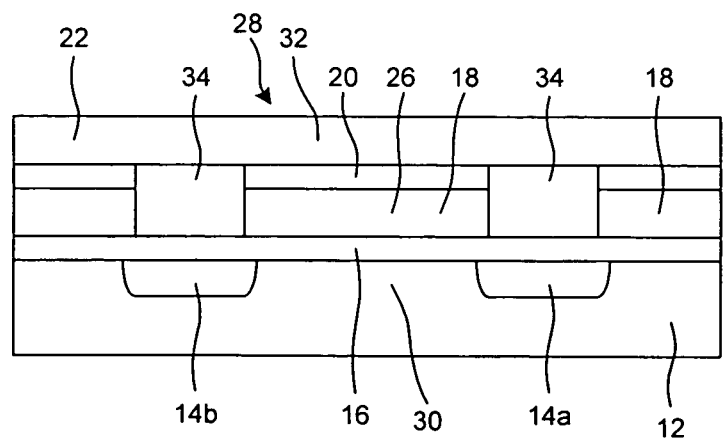
FIG. 3 is a schematic cross-section illustration of an exemplary core memory device from the core memory array taken along the line 3—3 of FIG. 2.

With additional reference to FIG. 3, the memory array 10 can include a semiconductor substrate 12 having a plurality of bitlines 14 (also referred to herein as conductive regions) formed in buried bitline format. Above the bitlines 14 is formed a lower dielectric layer, or tunnel dielectric layer 16, a charge storing layer 18, and a top dielectric layer 20. A plurality of wordlines 22 can be formed over the top dielectric layer 20. Bitline contacts 24 can be used to establish electrical connection to the bitlines 14.

In the illustrated embodiment, the charge storing layer 18 is conductive (e.g., made from doped-polysilicon) and forms a floating gate 26 in the area between adjacent bitlines 14 and under the wordlines 22 to operatively form a "floating gate" memory device (or cell) 28. For each device 28, adjacent pairs of bitlines 14 form conductive regions that function respectively as a source and a drain during various programming, verifying, reading and erasing operations. Interposed between each pair of bitlines 14, the substrate 12 forms a channel region 30 operatively controlled by the application of voltage to the corresponding wordline 22 that functions as a gate electrode. Therefore, the wordline 22 can be considered to define a control gate 32. In alternative arrangements, control gates are formed from individual conductive islands or pads that are interconnected by the wordlines 22. An interdielectric layer 34 may be present between the floating gates 26 to isolate the floating gates 26 from one another.

In another embodiment, the charge storing layer 18 is non-conductive (e.g., made from a dielectric material such as silicon nitride). This arrangement results in the formation of dielectric charge storing devices, or dual cell memory device, and includes a pair of complimentary charge trapping regions that can be independently programmed and read. Such a configuration allows for the storing of a first unit of charge (e.g., a normal bit) adjacent one of the bitlines 14 and a second unit of charge (e.g., a complementary bit) adjacent the other of the bitlines 14. In this embodiment, the charge storing layer 18 may continuously overlie the substrate in the area of the array 10.

In both embodiments, the application of appropriate voltages to the wordlines 22 and the bitlines 14 allows for the addressing of the memory devices 28 of the sector such that each memory device 28 can be programmed, read, verified and/or erased. For simplicity of the discussion herein, only the operation of one core memory device 28 will be described. However, the remaining memory devices 28 can have a corresponding structure and operation.

As one skilled in the art will appreciate, the illustrated memory device 28 is exemplary and modifications to the memory device 28 can be made. Such modifications can include changes to the physical arrangement of the core memory device 28 (e.g., type of memory device), materials used, doping parameters and the like. However, the programming, verifying, reading and/or erasing techniques described herein can be used in conjunction with such a modified device.

In one embodiment, each memory device 28 can be programmed to store a charge amount corresponding to one of multiple data states, such as four data states. The data states can represent a two bit binary word, such as a logical zero—zero, logical zero-one, logical one-zero and logical one—one. The logical one—one data state (or "11 program state"), for example, can be implemented by leaving the memory device 28 in an unprogrammed state or blank program level. The other logical data states, for example, can be implemented by storing distinguishable amounts of charge in the memory device 28 and are referred to by any of the following terms: charged states, programmed states, programmed levels or charged program levels. A lowest charged program level corresponding to the one-zero data state will be referred to herein as a "10 program state." A medium charged program level corresponding to the zero-one data state will be referred to herein as an "01 program state." A highest charged program level corresponding to the zero—zero data state will be referred to herein as an "00 program state."

Programming of the memory device 28 in accordance with the techniques described herein can be referred to as MLC data storage. As used herein, the term MLC data storage refers to independently "programming" each memory device 28 (or in the case of a dielectric charge storing device, programming each charge storing region of the device) with amount of charge selected from the four distinguishable amounts, including the blank program level and the three charged program levels. Therefore, in the MLC data storage embodiment, each floating gate memory device 28 (or "transistor") has four data states and each dielectric charge trapping memory device 28 has sixteen data states (four data states per charge trapping region for a total of sixteen logical combinations). In another embodiment, there can be more than three charged program levels.

For purposes of the present disclosure, the programming technique to store charge in the floating gate 26 involves hot electron injection, also referred to as channel hot electron injection (CHE). However, it should be appreciated that modifications to the programming techniques can be made to accommodate variations in the specific memory device used.

Using hot electron injection, the floating gate 26 can be programmed to store electrons by applying voltages to one of the bitlines 14 (e.g., bitline 14a functioning as the drain) and to the wordline 22 (e.g., functioning as the control gate 32). The other bitline 14 (e.g., bitline 14b functioning as the source) provides carriers (e.g., electrons) for the CHE programming of the memory device 28. In one embodiment, a bias voltage potential is applied to the source to supply greater control over electron injection, which leads to enhanced data retention capability of the memory device 28. For instance, the source bias potential can function to limit programming current of the programmed cell and reduce bitline leakage from unprogrammed cells on the same bitline.

The voltages applied to the control gate 32, the source and the drain of the programmed cell generate a vertical electric field through the dielectric layers 16 and 20 and the charge storing floating gate 26 and a lateral electric field along the length of the channel 30 from the source to the drain. At a given threshold voltage, the channel 30 will invert such that electrons are drawn off the source and begin accelerating toward the drain. As the electrons move along the length of the channel 30, the electrons gain energy and upon attaining enough energy, the electrons are able to jump over the potential barrier of the bottom dielectric layer 16 and into the floating gate 26 where the electrons become trapped. These accelerated electrons are termed hot electrons and once injected into the floating gate 26, stay in the floating gate 26.

Verifying the programmed state of the memory device 28 and reading of the memory device 28 can be carried out in similar manners. For example, to read the memory device 28, a voltage can be applied to one of the bitlines 14 which is also referred to as the drain during verify and read operations and a voltage can be applied to the control gate 32. The other bitline 14, which is also referred to as the source during verify and read operations, can be grounded. During these operations, an amount of current drawn across the channel 30 can be used as an indication of memory device 28 threshold voltage and can be compared against a reference current(s) (as indications of reference threshold voltages) to determine the data state of the "read" memory device 28.

Figure 4:
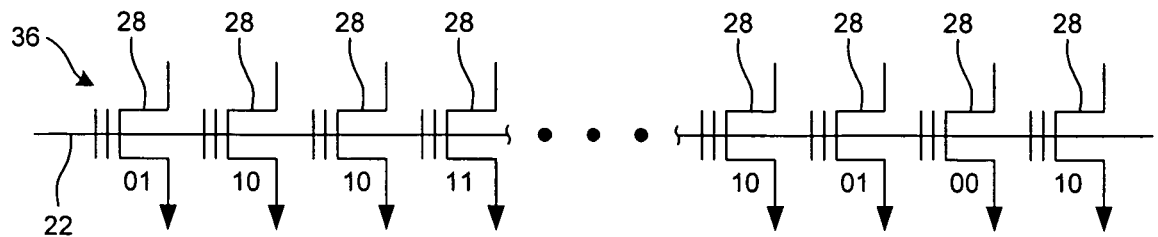
FIG. 4 is a schematic diagram of a row of memory devices to be programmed using multilevel charge (MLC) storage.

Turning now to FIG. 4, shown is a schematic diagram of a row 36 of memory devices 28 to be programmed using MLC. As described above, MLC programming involves either leaving the memory device 28 in a blank state to represent a first program state or injecting one of a plurality of distinguishable charge amounts into the charge storing layer 18 to represent program states corresponding to the charge amounts. To represent the storage of information with the memory devices 28 of the row 36, illustrated next to each memory device 28 is a two bit data value corresponding to a target program state for the memory device 28. For instance, the target program state for the first memory device 28 (starting on the left-hand side of FIG. 4) is the 01 program state, the target program state for the second memory device 28 is the 10 program state, and so forth.

Figure 5:
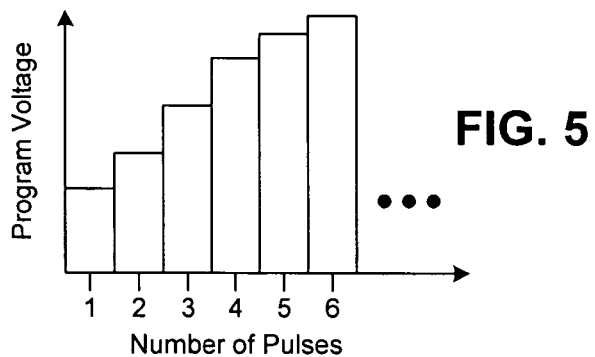
FIG. 5 is a graph of program voltage versus pulse number for an MLC program operation of the core memory array.

With additional reference to FIG. 5, shown is a representative graph of the program voltage applied to the control gate 32 of the memory device 28 during programming versus pulse number for MLC programming of the memory device 28. The actual program voltage per pulse can be program state dependent. That is, the initial program voltage for the first pulse and each subsequent program voltage for corresponding subsequent pulses can be different for each of the program states. As an example, the first pulse program voltage for the 10 program state could be 3.0 volts and the first pulse program voltage for the 01 program state could be 3.5 volts. In general, as the number of programming pulses applied to the memory device 28 for any give program state increases, the program voltage also increases. However, the program voltage need not increase as the pulse count is incremented. Therefore, incrementing the gate voltage includes increasing the gate voltage, decreasing the gate voltage and leaving the gate voltage the same as the previous pulse.

Figure 6:
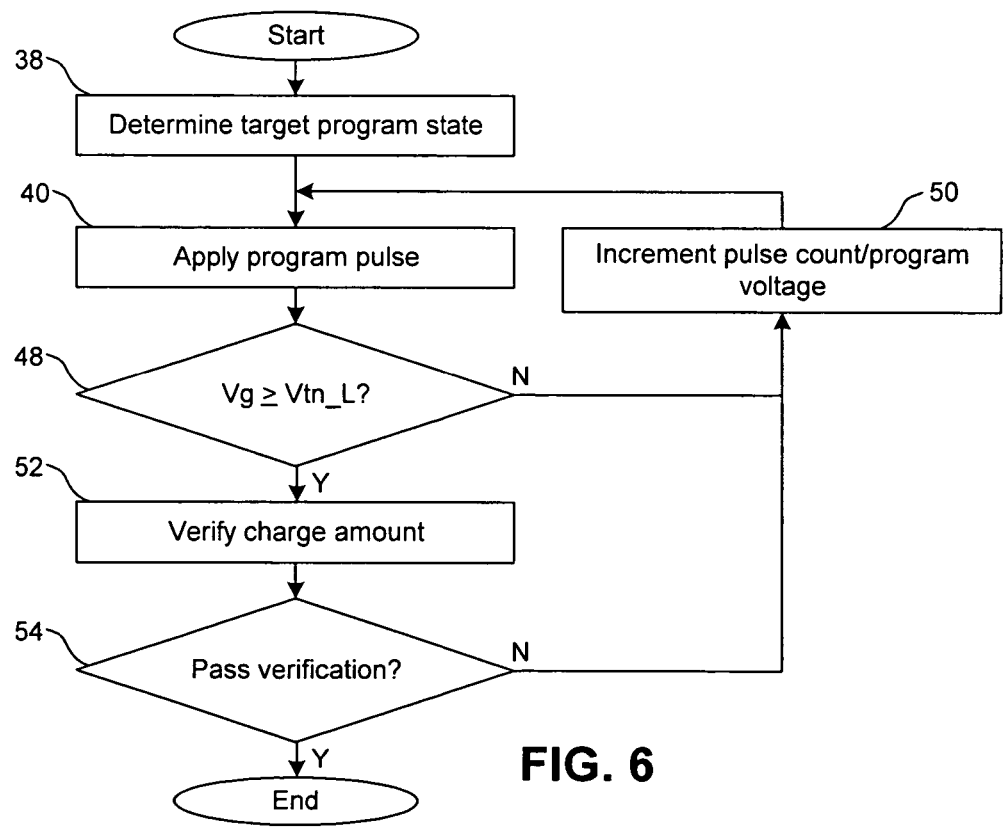
FIG. 6 is a flow diagram of a method of programming a core memory device using MLC storage according to the present invention.

With additional reference to FIG. 6, shown is an example flow diagram of a method of programming one of the memory devices 28 using MLC programming. The method depicted by FIG. 6 can be separately carried out for each memory device 28 of the memory unit 10 to be programmed to a charged program level. If the memory device 28 is a dielectric charge storing memory device, the method can be separately carried out for each charge storing region to be programmed to a charged program level.

The method can start in block 38 where the target program state for the memory device 28 undergoing programming is determined. If the program state is the 11 (blank) program state, the method can end with respect to the memory device 28 and another memory device 28 can be programmed. Assuming, however, that the target program state is one of the charged program levels, the method can proceed to block 40 where CHE programming of the memory device 28 is carried out. More specifically, a program pulse can be applied to the memory device 28. The program pulse can comprise a program gate voltage (sometimes referred to as a gate pump voltage or Vg) that is applied to the control gate 32 and a program drain voltage (sometimes referred to as a drain pump voltage of Vd) that is applied to the bitline 14 functioning as the drain for the memory device 28. The bitline 14 functioning as the source for the memory device 28 can be grounded or coupled to a bias potential during the program pulse. The potential applied to the source will be referred to herein as the source voltage or Vs.

Figure 7:
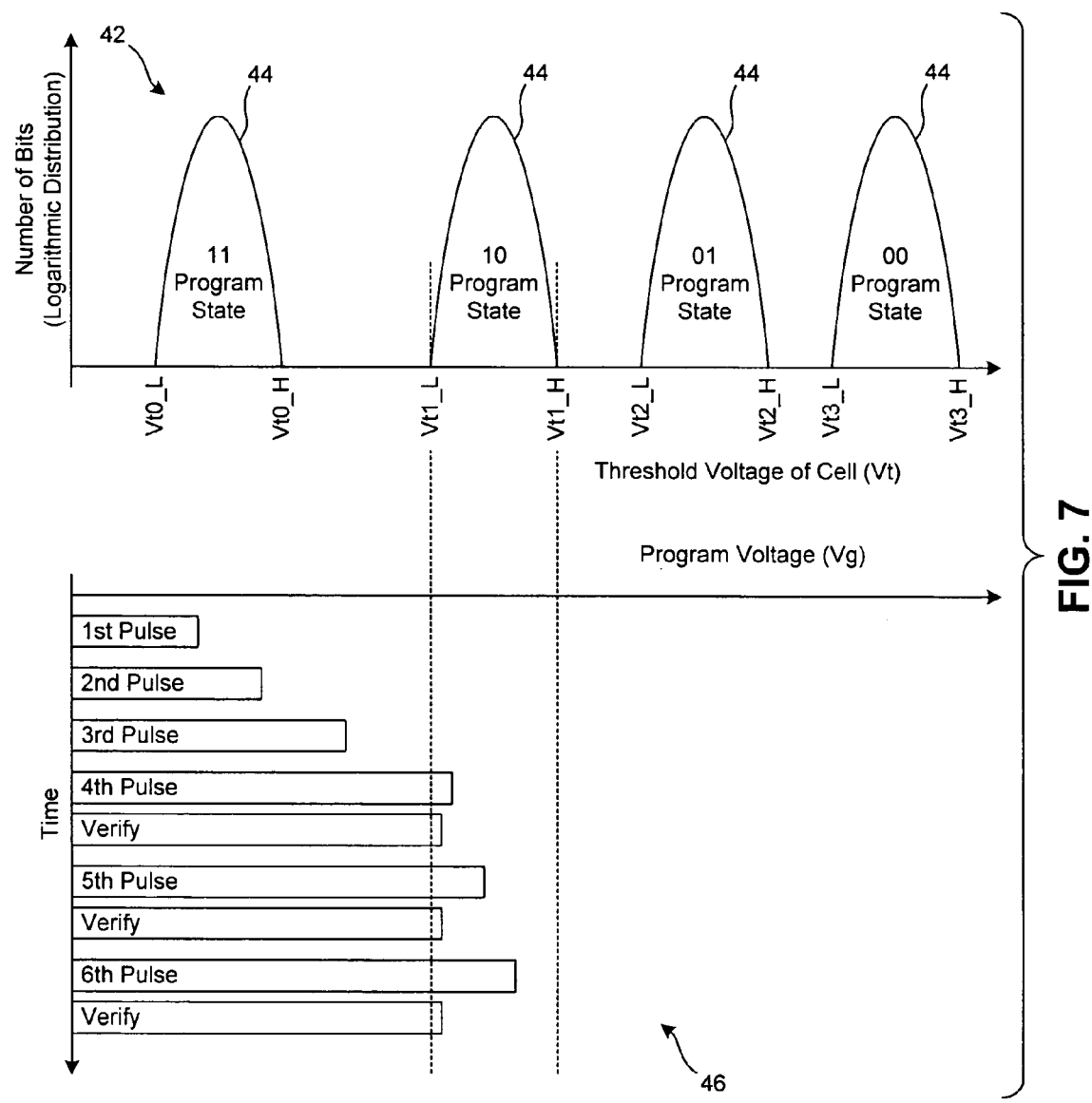
FIG. 7 is a population plot that includes relative program level threshold voltage distributions for MLC programming of the core memory device compared with a plot of voltages used to program and verify the core memory device when programmed in accordance with the present invention.

As indicated, the voltage applied to at least the control gate 32 during the program pulse can depend on the number of programming pulses applied to the memory device 28 and on the target program state. With additional reference to FIG. 7, shown is a population plot 42 that includes relative program level threshold voltage (Vt) distributions 44 that are indicative of the data states for MLC programming of the memory device 28. The population plot 42 is compared with a programming operation plot 46. The programming operation plot 46 includes a representation of the voltages applied to the control gate 32 during each program pulse and verify operation that are carried out during the method of FIG. 6.

MLC programming can be accomplished by associating each charged program level with specified program voltages for each pulse, including a gate voltage (Vg), a source voltage (Vs) and a drain voltage (Vd). The varying Vg, Vs and Vd for each program level allows control over the amount of charge stored in the charge storing layer 18 of the memory device 28. The programming pulse duration also can be controlled to regulate the amount of the charge injected in the memory device 28.

Following successful programming of the memory device 28, the threshold voltage (Vt) of the memory device 28 as evaluated during a verify operation should fall with the corresponding threshold voltage distribution 44. Each threshold voltage distribution 44 has a lower, or minimum, threshold voltage that is illustrated as Vtn_L, where n identifies the corresponding threshold voltage distribution 44. Similarly, each threshold voltage distribution 44 has an upper, or maximum, threshold voltage that is illustrated as Vtn$_{13}$ H, where n identifies the corresponding threshold voltage distribution 44.

For purposes of an example for the present disclosure, the target program state for the memory device 28 as determined in block 38 can be the 10 program state. Programming to either of the 01 program state or the 00 program state can be carried out in similar fashion and will be apparent to one of ordinary skill in the art from the example description of programming to the 10 program state. Therefore, a discussion of programming to 01 and 00 program states will be omitted for brevity of the present disclosure.

In the programming operation plot 46 of FIG. 7, the application of the first program pulse (block 40 of FIG. 6) is illustrated by the bar labeled first (1st) pulse. Referring to the x-axis of the programming operation plot 46, the length of this bar and the other bars of the programming operation plot 46 represent the voltage applied to the control gate 32.

Following a programming pulse as applied in block 40, the method can proceed to decision block 48. If, in block 48, the gate voltage Vg of the program pulse is not at least that of the lower threshold voltage Vtn_L corresponding to the target program state, then the method can proceed to block 50. In block 50, a program pulse count tracker can be incremented and/or the gate voltage Vg to be applied during the next program pulse can be selected (e.g., increased according to a predetermined programming scheme, such as illustrated in FIG. 5). Thereafter, the method can return to block 40 for application of the next program pulse followed by determination of whether the gate voltage Vg of the program pulse is at least that of the lower threshold voltage Vtn_L corresponding to the target program state in block 48.

In the illustrated example, the gate voltage Vg for each of the first three pulses (1st pulse, 2nd pulse and 3rd pulse) are less than the lower threshold voltage Vtn_L corresponding to the target program state (or Vt1_L in the example where the 10 program state is the target program state for the memory device 28). The next program pulse, or the fourth (4th) program pulse is at least as high as the lower threshold voltage Vtn_L corresponding to the target program state. Accordingly, following application of the fourth program pulse, a positive determination will be made in block 48 and the method will proceed to block 52.

In block 52 a verify operation is carried out to verify that the memory device 28 was programmed to the desired program state. For example, the verify operation can include comparing a drain to source current of the memory device 28 that is generated when appropriate voltages are applied to the control gate 32, the source and/or the drain against a current generated by an external verify reference device corresponding to the desired program state. Accordingly, the external references 6 (FIG. 1) can include at least three fixed (e.g., statically charged) program verify references, each capable of providing a reference current corresponding to the charged program states for verifying charge storage.

If, in decision block 54, a positive determination is made that the memory device 28 is programmed to the target program state, then the method of programming the memory device 28 can end. Subsequently, another memory device 28 of the memory unit 2 can be programmed using the foregoing method. If a negative determination is made in block 54, the method can return to block 50 where the program pulse count tracker can be incremented and/or the gate voltage Vg to be applied during the next program pulse can be selected (e.g., increased according to a predetermined programming scheme, such as illustrated in FIG. 5). Thereafter, the method can loop until a positive determination is made in block 54. In the illustrated example, fifth and sixth program pulses and verify operations are carried out. As one skilled in the art will appreciate, the actual number of pulses applied to a given memory device 28 to program the memory device 28 to a target program state may vary based on a number of operational factors. Reading and/or erasing of the memory device 28 can be carried out using conventional techniques.

Since the gate voltage associated with each program pulse for each of the program levels can differ and since the minimum threshold voltage for each program level threshold voltage distribution differs for each program voltage, the number of program pulses applied to a particular memory device 28 for each of the various charged program states before verifying the threshold voltage of the memory device 28 may vary. Accordingly, the method illustrated by FIG. 5 can be considered to be a program state (or charge level) dependent program/verify scheme.

As should be apparent, the programming technique of the present invention can be used to decrease operational overhead. More specifically, the amount of time to program an individual memory cell 28 can be reduced since verify operations are not performed after initial program pulses, but only after program pulses where the gate voltage Vg is greater than or equal to a minimum threshold voltage of the target program level threshold distribution. As should be appreciated, when the amount of time used to program each individual memory device 28 of a sector 10 of the memory unit 2 is reduced, the overall time to program the sector is correspondingly reduced. As a result, the programming techniques described herein can improve memory unit 2 operation by reducing the amount of time to store data with the memory unit 2.

To be able to distinguish amount the program states, the program level threshold voltage distributions 44 should be precisely defined and charge injection should be controlled so that the memory devices 28 store an amount of charge corresponding to the respective target program states. While overshooting program level threshold voltage distribution has previously been a concern, overshooting of the program level threshold voltage distributions in the MLC programming method described herein has been determined to be a minimal issue.

As should be appreciated, the methods of programming one or more memory devices 28 described herein can be embodied as executable instructions executed by the logic circuit 8. Alternatively, the programming methods can be embodied as hardware by the logic circuit 8 (e.g., a dedicated circuit arrangement) or as a combination of executable logic and hardware.

Although particular embodiments of the invention have been described in detail, it is understood that the invention is not limited correspondingly in scope, but includes all changes, modifications and equivalents coming within the spirit and terms of the claims appended hereto.

The invention claimed is:

1. A method of programming a flash memory device to store an amount of charge corresponding to a target charged program state from a plurality of charged program states, comprising:

successively pulsing the memory device with program voltages including a gate voltage until the gate voltage is greater than or equal to a minimum threshold voltage for the target charged program state; and verifying the program state of the memory device when the gate voltage is greater than or equal to a minimum threshold voltage for the target charged program state;

wherein each successive pulse before the gate voltage is greater than or equal to the minimum threshold voltage for the target charged program state is carried out without being followed by a verify operation.

2. The method according to claim 1, wherein if the verifying fails, then repulsing and reverifying the memory device.

3. The method according to claim 2, wherein the repulsing includes incrementing the gate voltage according to a pulse count.

4. The method according to claim 1, wherein for each successive pulse, the gate voltage is incremented according to a pulse count.

5. The method according to claim 1, wherein the memory device is a floating gate device.

6. The method according to claim 5, wherein there are three charged program states and a blank program state.

7. The method according to claim 1, wherein the memory device is a charge trapping dielectric memory device having plural charge trapping regions.

8. The method according to claim 7, wherein each charge trapping region stores an amount of charge corresponding to one of three charged program states or a blank program state.

9. The method according to claim 1, wherein storing charge is accomplished by channel hot electron injection.

* * * * *

UNITED STATES PATENT AND TRADEMARK OFFICE
CERTIFICATE OF CORRECTION

| | |
|---|---|
| PATENT NO. | : 7,042,766 B1 |
| APPLICATION NO. | : 10/896651 |
| DATED | : May 9, 2006 |
| INVENTOR(S) | : Wang et al. |

It is certified that error appears in the above-identified patent and that said Letters Patent is hereby corrected as shown below:

Column 7, line 8: Replace "$Vtn_{13}$ H, where" with --Vtn_H, where--.

Column 8, line 63: Replace "The invention claimed is:" with --What is claimed is:--

Signed and Sealed this

Fifteenth Day of August, 2006

JON W. DUDAS
*Director of the United States Patent and Trademark Office*